US012576664B2

(12) United States Patent
Pueschner et al.

(10) Patent No.: US 12,576,664 B2
(45) Date of Patent: Mar. 17, 2026

(54) METHOD FOR CREATING A DOCUMENT STRUCTURE, AND DOCUMENT STRUCTURE

(71) Applicant: Infineon Technologies AG, Neubiberg (DE)

(72) Inventors: Frank Pueschner, Kelheim (DE); Peter Stampka, Burglengenfeld (DE); Jens Pohl, Bernhardswald (DE); Uwe Wagner, Abbach (DE); Thomas Spoettl, Mintraching (DE)

(73) Assignee: Infineon Technologies AG, Neubiberg (DE)

( * ) Notice: Subject to any disclaimer, the term of this patent is extended or adjusted under 35 U.S.C. 154(b) by 742 days.

(21) Appl. No.: 17/866,777

(22) Filed: Jul. 18, 2022

(65) Prior Publication Data

US 2023/0021853 A1    Jan. 26, 2023

(30) Foreign Application Priority Data

Jul. 23, 2021    (DE) .......................... 102021119190.4

(51) Int. Cl.
H01L 23/00        (2006.01)
B42D 25/305        (2014.01)
(Continued)

(52) U.S. Cl.
CPC ............ H01L 24/24 (2013.01); B42D 25/305 (2014.10); H01L 21/56 (2013.01);
(Continued)

(58) Field of Classification Search
CPC ....... H01L 24/24; H01L 24/305; H01L 21/56; H01L 23/3107; H01L 23/4985
See application file for complete search history.

(56) References Cited

U.S. PATENT DOCUMENTS 6,027,027 A * 2/2000 Smithgall ........ G06K 19/07749
235/487
9,899,330 B2 * 2/2018 Dalal ...................... H01L 24/00
(Continued)

FOREIGN PATENT DOCUMENTS

DE        19840220 A1    4/2000
DE        19846237 A1    4/2000

OTHER PUBLICATIONS

Apr. 1, 2022 (DE) Office Action—App 102021119190.4.

*Primary Examiner* — Nathan W Ha

(57)        ABSTRACT

A method for producing a document structure, wherein the method includes producing a chip structure by forming a cavity in a carrier having a top side and an under side, picking up a chip having at least one chip contact and a redistribution layer (RDL) connected to the at least one chip contact by means of a picking-up device detaching the chip from an auxiliary carrier, wherein the chip bears on the auxiliary carrier by way of the RDL, wherein the chip is lifted up from the auxiliary carrier by means of pressure being exerted on the RDL, wherein the lifted-up chip is picked up and inserted into the cavity, and wherein the RDL is oriented on the top side of the carrier, fixing the chip in the cavity by means of an adhesive, electrically conductively connecting the at least one chip contact of the RDL to an electrically conductive region of the carrier by means of an electrically conductive material, and embedding the carrier between a first paper layer and a second paper layer.

10 Claims, 9 Drawing Sheets

(51) Int. Cl.
| | |
|---|---|
| *H01L 21/56* | (2006.01) |
| *H01L 23/31* | (2006.01) |
| *H01L 23/498* | (2006.01) |
| *H01Q 1/22* | (2006.01) |

(52) U.S. Cl.
CPC ...... *H01L 23/3107* (2013.01); *H01L 23/4985* (2013.01); *H01L 2224/2405* (2013.01); *H01L 2224/24101* (2013.01); *H01L 2224/24265* (2013.01); *H01Q 1/2208* (2013.01)

(56) References Cited

U.S. PATENT DOCUMENTS

| | | | | |
|---|---|---|---|---|
| 10,608,125 | B1* | 3/2020 | Zhou | H01L 24/24 |
| 2001/0004132 | A1* | 6/2001 | Bergstedt | H01L 23/13 |
| | | | | 257/E23.106 |
| 2001/0045641 | A1* | 11/2001 | Hauser | H01L 21/561 |
| | | | | 257/697 |
| 2006/0043200 | A1* | 3/2006 | Puschner | G06K 19/07747 |
| | | | | 235/492 |
| 2008/0076209 | A1* | 3/2008 | Klink | H01L 24/97 |
| | | | | 257/E23.178 |
| 2008/0116564 | A1* | 5/2008 | Yang | H01L 24/24 |
| | | | | 257/E21.505 |
| 2008/0157316 | A1* | 7/2008 | Yang | H01L 24/82 |
| | | | | 257/685 |
| 2008/0173792 | A1* | 7/2008 | Yang | H10F 39/804 |
| | | | | 250/208.1 |
| 2008/0217761 | A1* | 9/2008 | Yang | H01L 24/19 |
| | | | | 257/737 |
| 2010/0038432 | A1* | 2/2010 | Mueller-Hipper | B42D 25/00 |
| | | | | 29/601 |
| 2010/0237506 | A1* | 9/2010 | Brunnbauer | H01L 24/11 |
| | | | | 257/E21.59 |
| 2012/0194719 | A1* | 8/2012 | Churchwell | H01L 24/19 |
| | | | | 348/E5.091 |
| 2013/0032388 | A1* | 2/2013 | Lin | H01L 23/49827 |
| | | | | 29/829 |
| 2013/0082112 | A1* | 4/2013 | Pueschner | G06K 19/07747 |
| | | | | 156/305 |
| 2013/0105950 | A1* | 5/2013 | Bergemont | H01L 23/552 |
| | | | | 257/659 |
| 2014/0027709 | A1* | 1/2014 | Higginson | H10D 86/0212 |
| | | | | 438/26 |
| 2015/0366067 | A1* | 12/2015 | Herbert | H01L 23/4822 |
| | | | | 361/761 |
| 2016/0004947 | A1* | 1/2016 | Pueschner | G06K 19/07722 |
| | | | | 29/601 |
| 2016/0126210 | A1* | 5/2016 | Standing | H01L 23/3737 |
| | | | | 257/785 |
| 2017/0047308 | A1* | 2/2017 | Ho | H01L 23/5386 |
| 2019/0132983 | A1* | 5/2019 | Weis | H01L 23/34 |
| 2019/0267336 | A1* | 8/2019 | Raorane | H01L 23/66 |
| 2019/0306988 | A1* | 10/2019 | Grober | H05K 1/112 |
| 2020/0058579 | A1* | 2/2020 | Lu | H01L 23/49838 |
| 2020/0075519 | A1* | 3/2020 | Lin | H01L 24/83 |
| 2020/0105663 | A1* | 4/2020 | Tsai | H01L 23/5389 |
| 2020/0219816 | A1* | 7/2020 | Aleksov | H01L 24/17 |
| 2020/0227377 | A1* | 7/2020 | Liff | H01L 25/50 |
| 2020/0243448 | A1* | 7/2020 | Qian | H01L 21/4853 |
| 2020/0312747 | A1* | 10/2020 | Cook | H01L 23/498 |
| 2020/0395308 | A1* | 12/2020 | Wu | H01L 23/367 |
| 2022/0015224 | A1* | 1/2022 | Huang | H05K 3/30 |
| 2024/0105669 | A1* | 3/2024 | Pohl | H01L 24/85 |

* cited by examiner

FIG. 3A
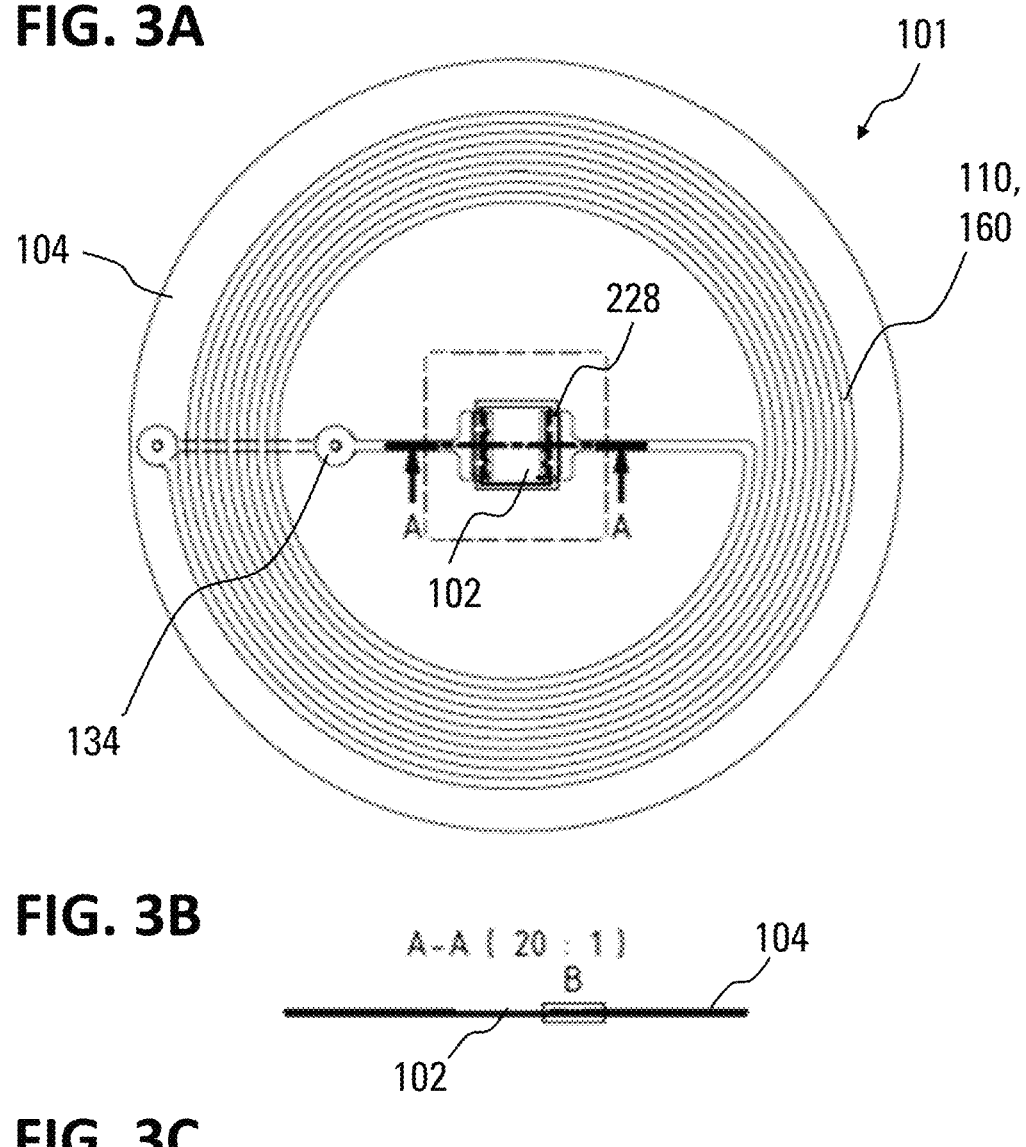
FIG. 3B
FIG. 3C
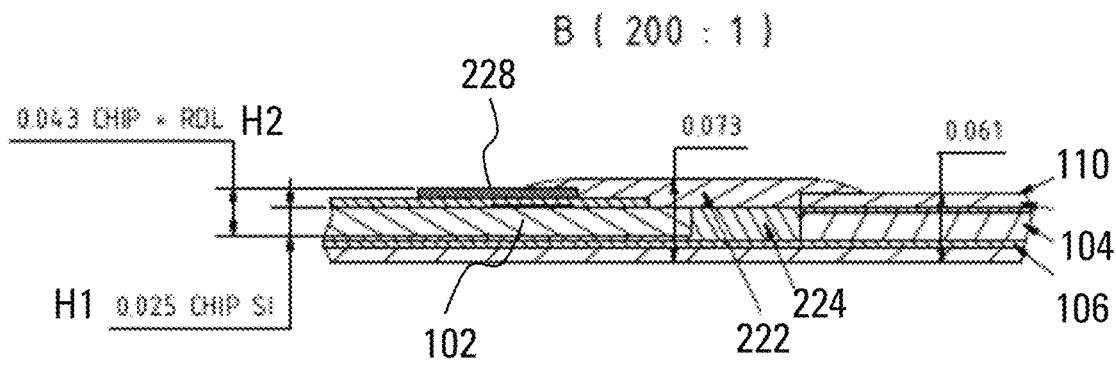

FIG. 5

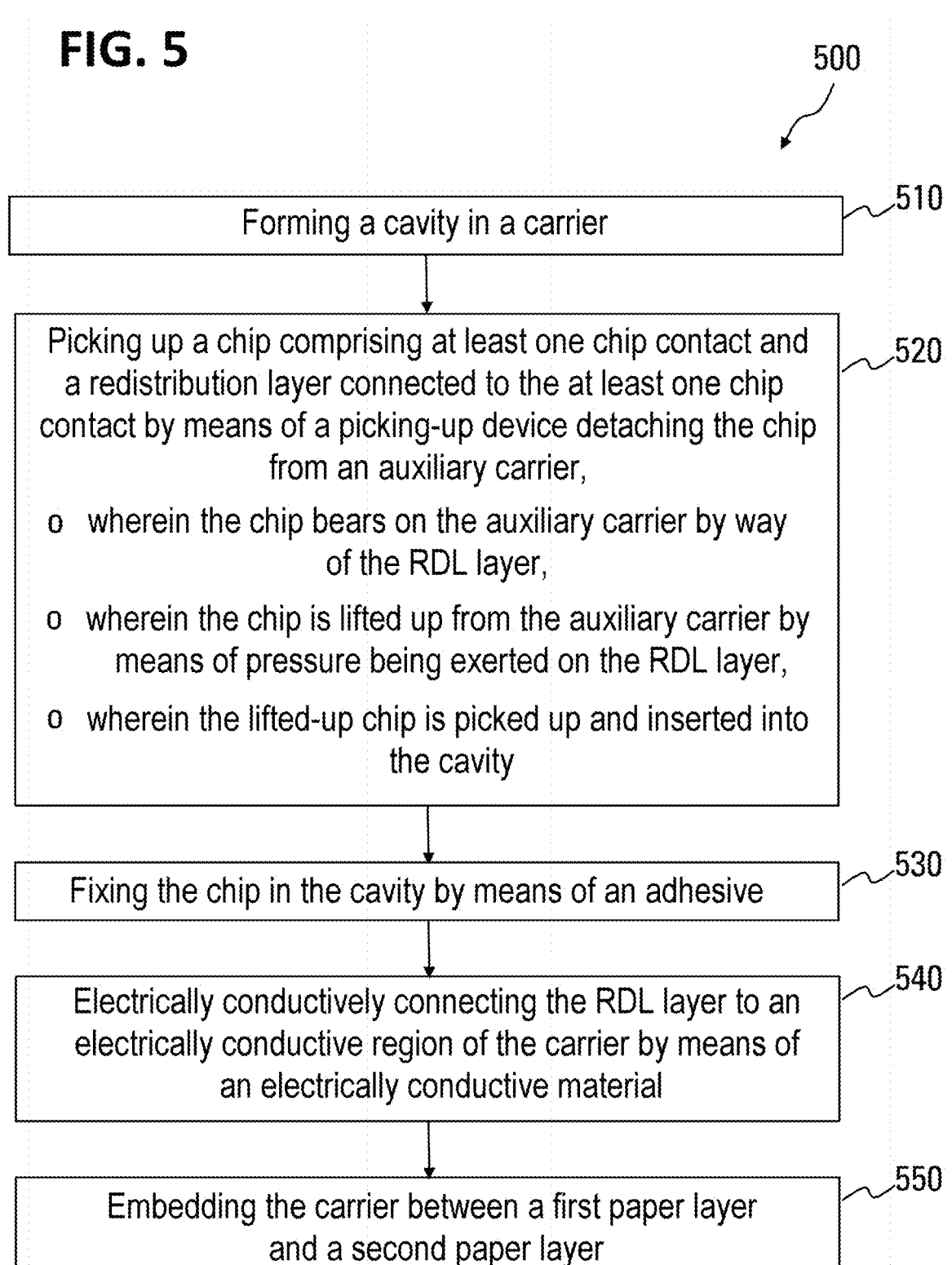

500

Forming a cavity in a carrier ⟋510

Picking up a chip comprising at least one chip contact and a redistribution layer connected to the at least one chip contact by means of a picking-up device detaching the chip from an auxiliary carrier, ⟋520 o   wherein the chip bears on the auxiliary carrier by way of the RDL layer, o   wherein the chip is lifted up from the auxiliary carrier by means of pressure being exerted on the RDL layer, o   wherein the lifted-up chip is picked up and inserted into the cavity Fixing the chip in the cavity by means of an adhesive ⟋530

Electrically conductively connecting the RDL layer to an electrically conductive region of the carrier by means of an electrically conductive material ⟋540

Embedding the carrier between a first paper layer and a second paper layer ⟋550

METHOD FOR CREATING A DOCUMENT STRUCTURE, AND DOCUMENT STRUCTURE

TECHNICAL FIELD

The disclosure relates to a method for producing a document structure, and to a document structure.

BACKGROUND

For various applications, such as for example (e.g. crypto-) banknotes, documents, etc., it is desirable to embed a chip in paper layers.

The chip should be able to provide contactless communication, for example as near field communication (NFC), for example as a passive element that receives energy by means of near field communication, e.g. from a smartphone, and—depending on the planned use—should be configured to implement application-related functions, e.g. to sign transactions (e.g. by means of elliptic curve cryptography, e.g. a so-called Elliptic Curve Digital Signature Algorithm (ECDSA)).

The chip itself is typically too small, however, to allow an antenna suitable for NFC to be accommodated directly on the chip.

Furthermore, present-day chip arrangements are typically too thick or break down too quickly during a production process or during later use.

Assuming a conventional banknote having a thickness of between approximately 90 μm and 110 μm, and assuming that two layers of paper each approximately 35 μm thick should be present for providing the banknote functionality (e.g. for securing/holding the chip and in order to hamper or prevent mechanical manipulation), this leaves between 20 μm and 40 μm for a layer in which the chip having the described functionality is to be accommodated, possibly somewhat more, for example up to approximately 70 μm, if a somewhat thicker banknote is acceptable.

SUMMARY

In various exemplary embodiments, a document structure having a chip is provided which satisfies the described requirements with regard to functionality, thickness and robustness.

The document structure can be equipped with a carrier and a flat metal antenna (e.g. formed as a metallization layer) arranged thereon, said antenna having an antenna area of e.g. approximately 25 mm×25 mm. In this case, the chip can be arranged within the antenna area, e.g. as a so-called "Chip in Coil" (CiC) arrangement.

BRIEF DESCRIPTION OF THE FIGURES

Exemplary embodiments of the disclosure are illustrated in the figures and are explained in greater detail below.

In the figures:

FIGS. 3A to 3E show various views of a chip structure of a document structure in accordance with various exemplary embodiments;

FIG. 3F shows a perspective plan view of a chip component of the chip structure from FIGS. 3A to 3E;

FIG. 5 shows a flow diagram of a method for producing a document structure.

DETAILED DESCRIPTION

Figure 1A:
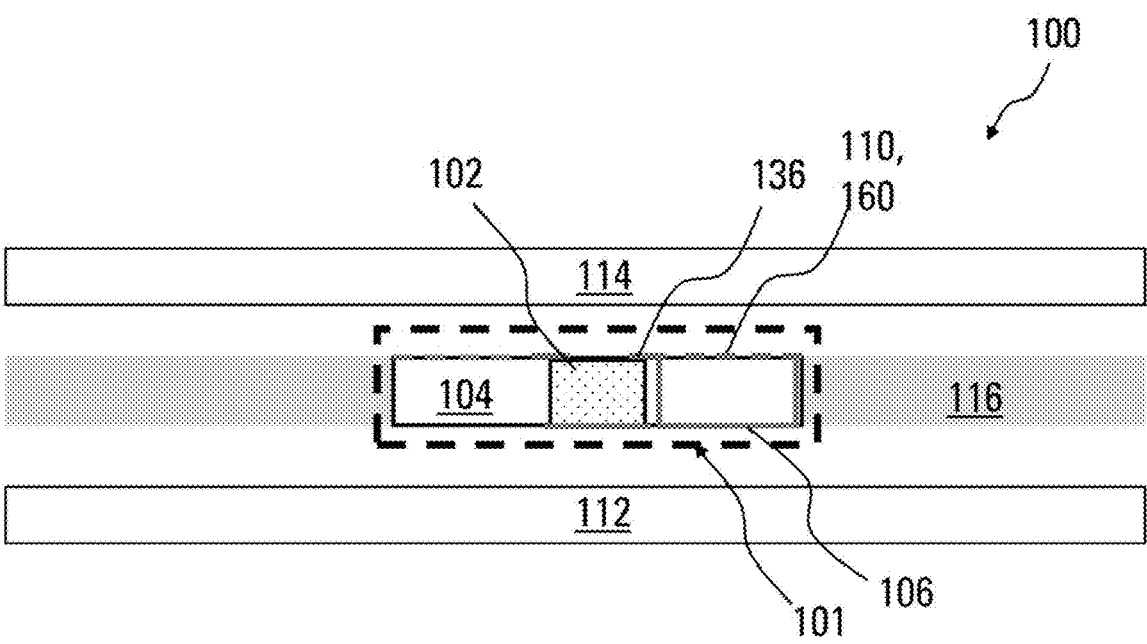
FIGS. 1A to 1C each show a schematic partially exploded cross-sectional view of a document structure in accordance with various exemplary embodiments.

In the following detailed description, reference is made to the accompanying drawings, which form part of this description and show for illustration purposes specific embodiments in which the disclosure can be implemented. In this regard, direction terminology, such as, for instance, "at the top", "at the bottom", "at the front", "at the back", "front", "rear", etc. is used with respect to the orientation of the figure(s) described. Since components of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection, a direct or indirect attachment and a direct or indirect coupling. In the figures, identical or similar elements are provided with identical reference signs, in so far as this is expedient.

In various exemplary embodiments, an ultrathin chip structure is provided, which is able to be embedded in two paper layers in order to form a document structure. The chip structure can be provided as a Chip in Coil (CiC) structure, for example having a thickness of at most approximately 60 μm to approximately 70 μm.

During integration of an ultrathin semiconductor chip into a thin flexible substrate, in various exemplary embodiments, a combination of design features, materials and (e.g. already substantially known) processes is used in order to enable cost-effective production with a high throughput.

In various exemplary embodiments, the (ultrathin) chip can be equipped with a redistribution layer (RDL), which can provide mechanical reinforcement, in particular for a so-called pick-and-place process, in which the singulated chip is detached from an auxiliary carrier and positioned at the target position. The redistribution layer can comprise at least two regions which are electrically insulated from one another and which can be fashioned so as to avoid a (in particular continuously linear) predetermined breaking edge.

In various exemplary embodiments, the insulating region of the RDL layer can be formed without a principal axis, or have a principal axis, within which or in the extension of which at least one part of a first RDL layer region and/or of a second RDL layer region is arranged.

Furthermore, in various exemplary embodiments, before the pick-and-place process the chip can be arranged on the auxiliary carrier in such a way that the RDL layer faces the auxiliary carrier. The RDL layer can be in direct contact for example with the auxiliary carrier, e.g. have a common interface.

The RDL layer can have for example a thickness in a range of approximately 10 μm to approximately 40 μm.

The chip can have for example a thickness in a range of approximately 20 μm to approximately 40 μm.

In various exemplary embodiments, the thickness of the RDL can be chosen such that a ratio of the RDL thickness to the chip thickness is in a range of approximately 0.1 to approximately 1, e.g. approximately 0.3 to approximately 1.

In various exemplary embodiments, a total thickness of the chip with the RDL layer can be less than approximately 50 μm.

In various exemplary embodiments, the RDL layer can be electrically conductively connected to chip contacts and be configured to provide contact pads for (simplified and/or reliable) connection of electrically conductive structures to the chip contacts. The electrically conductive structures can comprise for example an antenna and/or a connection to an antenna.

In various exemplary embodiments, the RDL layer can be arranged on a main surface of the chip and optionally additionally on one or more side surfaces of the chip.

The electrically conductive connecting can be or have been carried out for example by means of a soldering connection or by means of an electrically conductive adhesive.

A carrier in which the chip is/has been arranged can be flexible, e.g. elastic. The carrier can comprise for example an elastic plastics material, e.g. comprise polycarbonate, polyethylene terephthalate, and/or polyimide. The carrier can be formed from a single material or for example from a layer stack. The carrier can for example comprise a substantially known, so-called flextape.

Figure 1B:
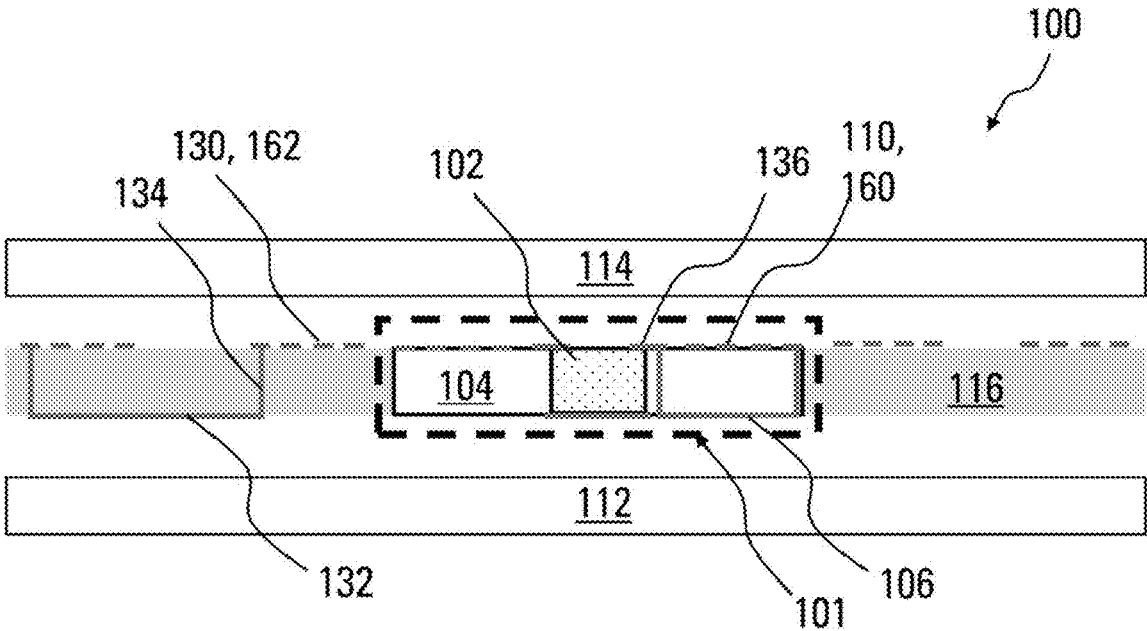
Figure 1C:
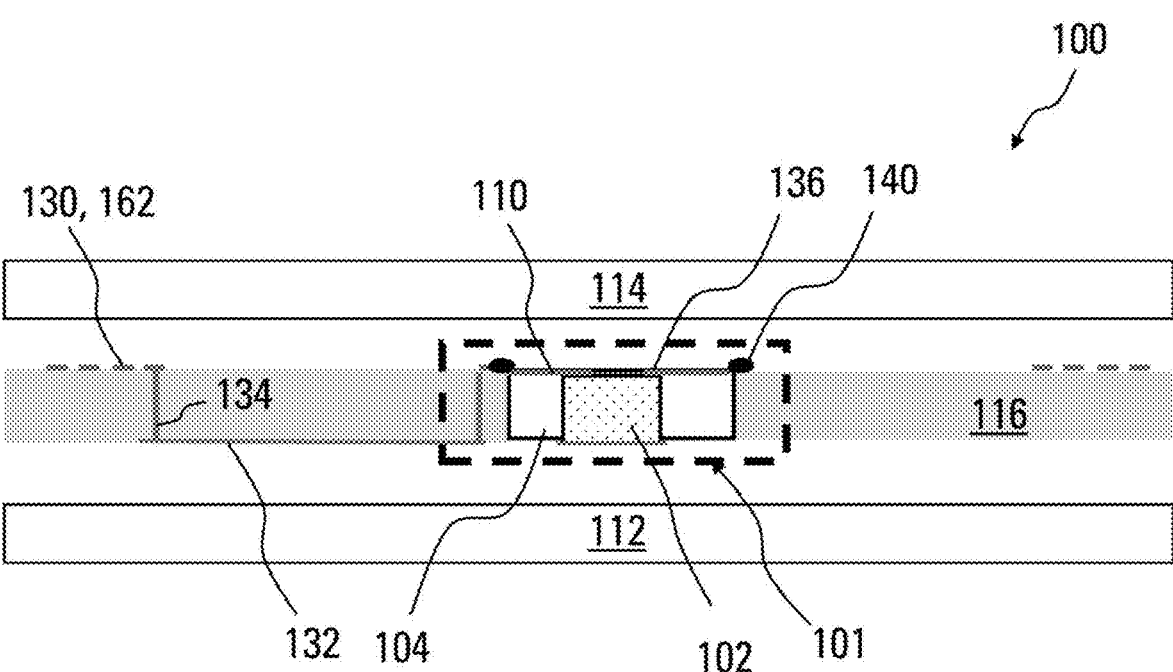

FIGS. 1A to 1C each show a schematic partially exploded cross-sectional view of a document structure 100 in accordance with various exemplary embodiments, each comprising a chip structure 101.

Figure 2A:
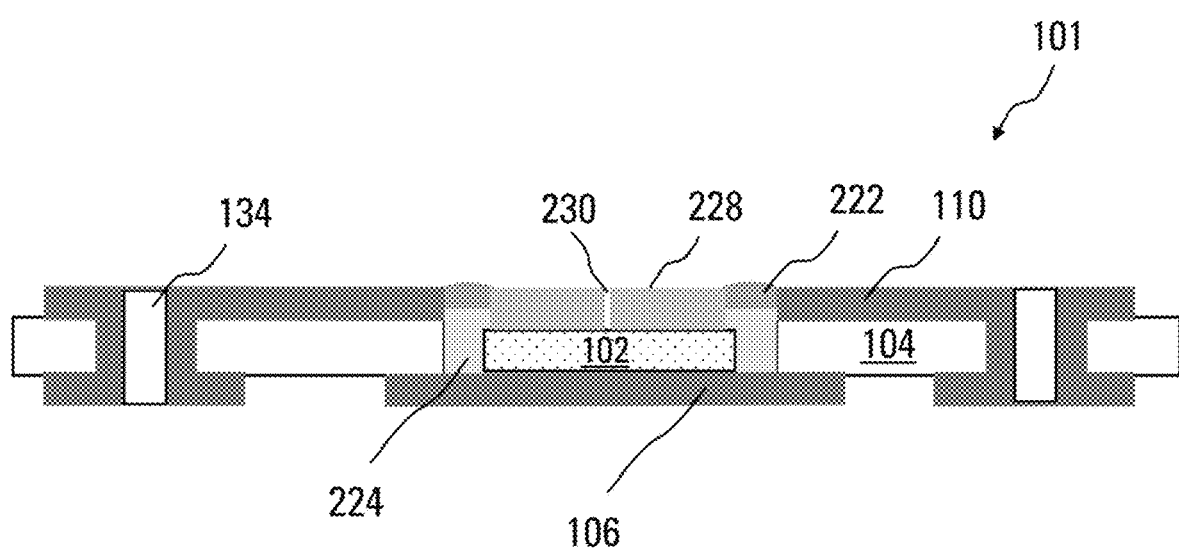
FIGS. 2A and 2C each show a schematic cross-sectional view of a chip structure of a document structure in accordance with various exemplary embodiments.
Figure 2B:
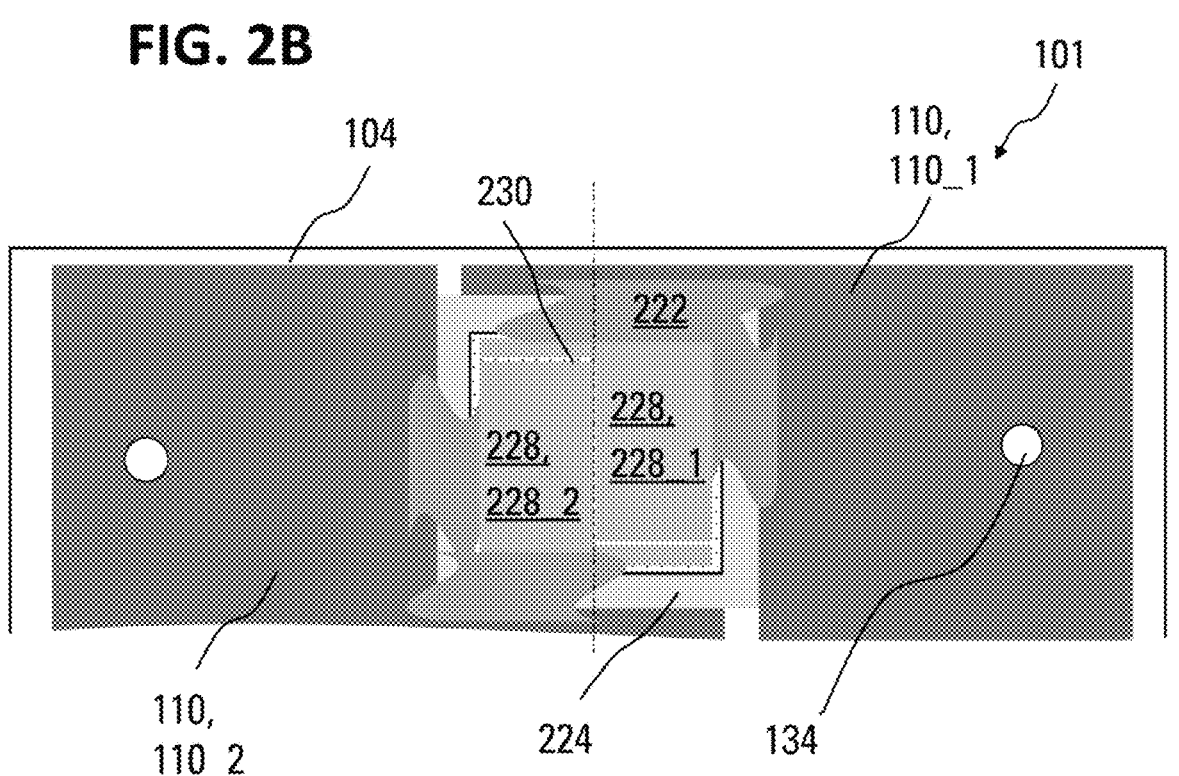
FIG. 2B shows a plan view of the chip structure from FIG. 2A and FIG. 2C.
Figure 2C:
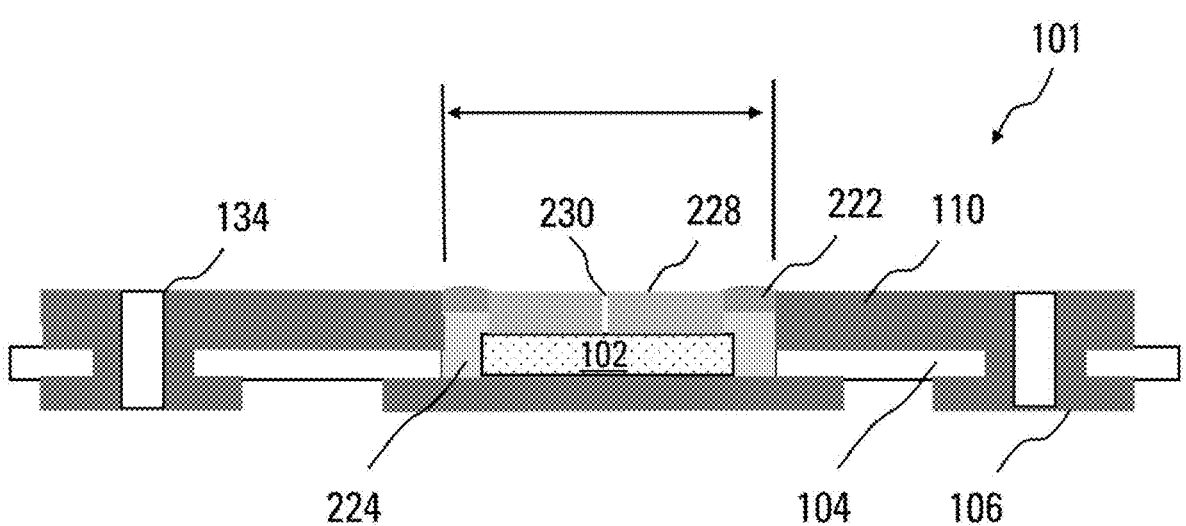

FIGS. 2A and 2C each show a schematic cross-sectional view of a chip structure 101, for example a chip structure 101 which is used in the document structures 100 in FIGS. 1A to 1C. FIG. 2B shows a plan view of the chip structure 101 from FIG. 2A and FIG. 2C (the difference between them is only apparent in cross section).

FIGS. 3A to 3E show various views (e.g. plan view from above and below, perspective view, cross-sectional views as detail enlargement, etc.) of a chip structure 101 of a document structure 100 in accordance with various exemplary embodiments.

Figure 3D:
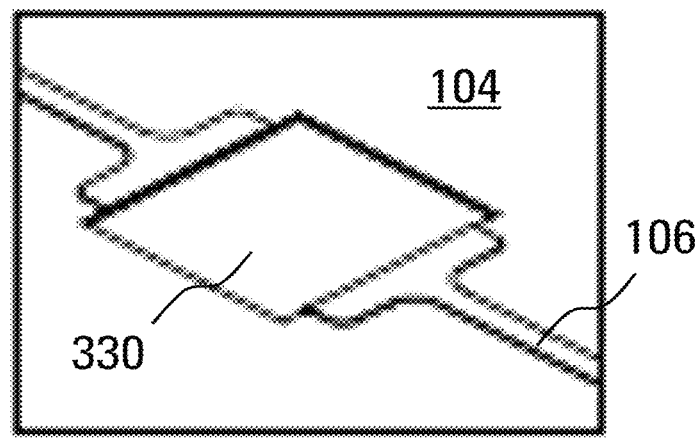
Figure 3D:
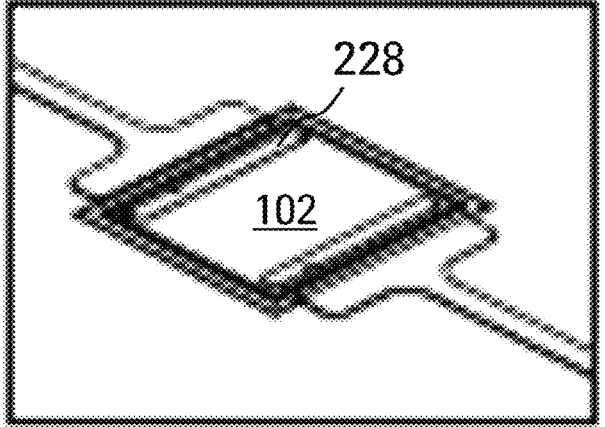
Figure 3D:
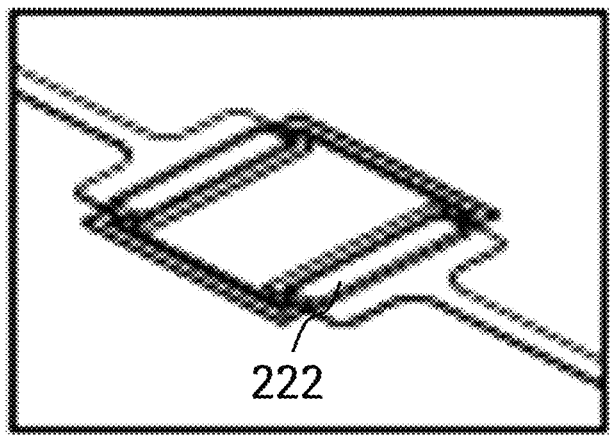
Figures 3E, 3F:
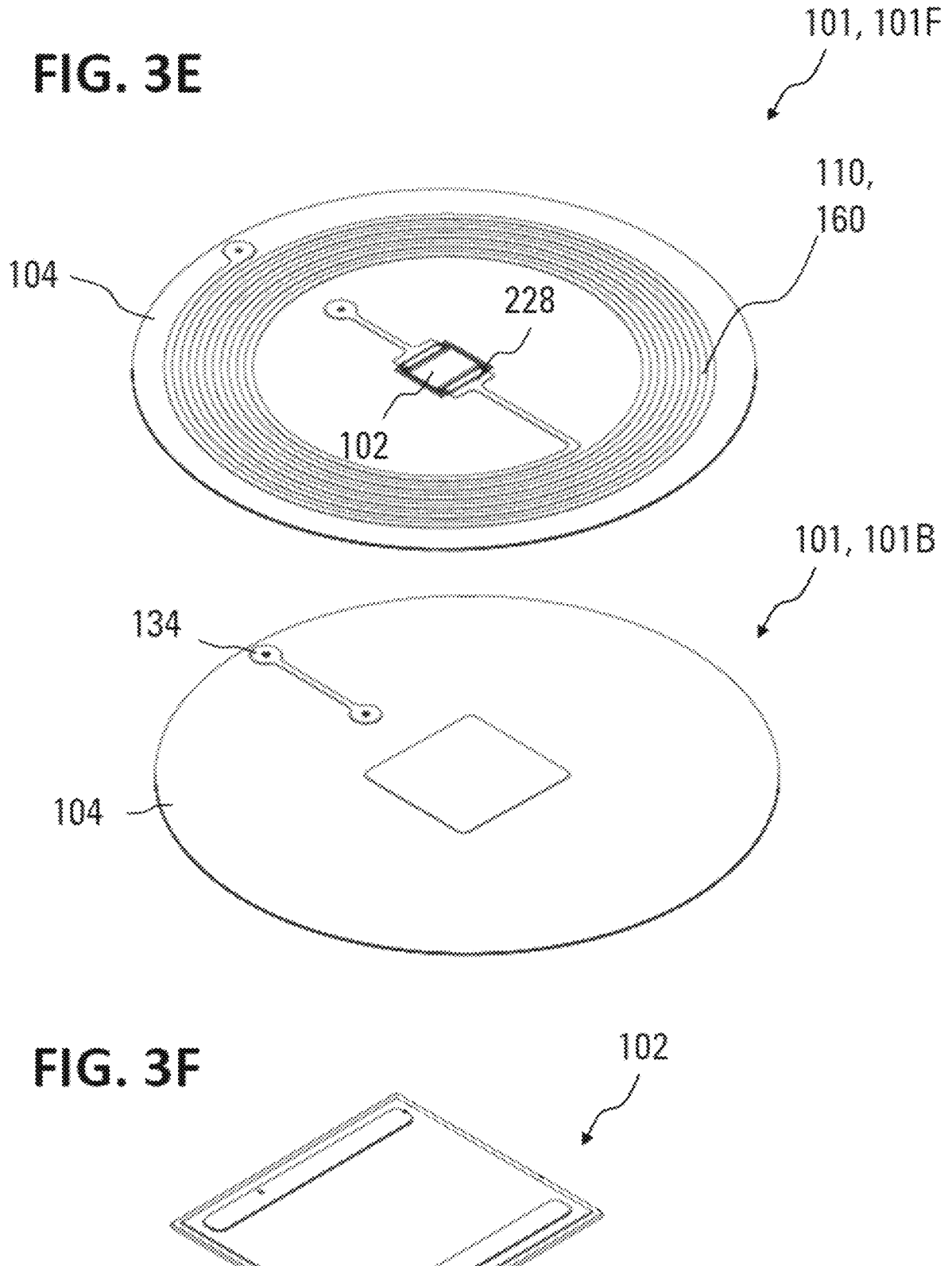

FIG. 3F shows a perspective plan view of a chip component 102, 228 of the chip structure 101 from FIGS. 3A to 3E.

The document structure 100 comprises a first paper layer 112, a second paper layer 114 and a chip structure 101 between the first paper layer 112 and the second paper layer 114.

In FIGS. 1A to 1C, for the sake of clarity, the first paper layer 112 and the second paper layer 114 are shown spaced apart from an interlayer 116, in which the chip structure 101 is embedded. In order to form the document structure 100, the first and second paper layers 112, 114 are fixedly connected, e.g. adhesively bonded or laminated, to the interlayer 116 and the chip structure 101.

The chip structure 101 can comprise a carrier 104 having a cavity 330 (see FIG. 3D). The cavity 330 can be formed as a through opening in the carrier 104. In that case the opening can be closed off toward one side temporarily during a chip embedding process or permanently in some other way, for example by means of a (e.g. lower) metallization layer 106 as illustrated in FIG. 2A and FIG. 2C. Alternatively, the cavity 330 can be formed in the carrier 104 in such a way that a bottom closure layer remains for holding/carrying a chip 102.

A typical chip 102 can have a side length of typically approximately 1.5 mm. Accordingly, a side length of the cavity 330 can be somewhat larger, for example approximately 2 mm. Generally, the cavity 330 can be fabricated with a slight oversize relative to the chip 102 to be introduced.

The carrier 104 can comprise a flexible (e.g. elastic) dielectric material, for example polycarbonate, polyimide or polyethylene terephthalate. Alternatively, the carrier 104 can comprise an elastic metal. The carrier 104 can have for example a thickness of approximately 25 μm, which corresponds to a standard thickness for a carrier tape, or can be thinner, for example, which is illustrated in FIG. 2C (where a thickness of the electrically conductive region 110 is correspondingly increased to approximately 30 μm).

The chip structure 101 can furthermore comprise a chip 102 having at least one chip contact, wherein the chip 102 is arranged in the cavity 330. The chip 102 can be secured in the cavity 330, e.g. by means of a nonconductive adhesive 224.

The chip 102 can be an ultrathin chip 102, which can have a thickness in a range of approximately 20 μm to approximately 40 μm, for example of approximately 30 μm. The chip thickness can be smaller than a depth of the cavity 330.

The chip 102 can be configured to carry out near field communication (NFC) by means of an antenna 160, 162 connected to said chip.

The chip 102 can furthermore comprise a redistribution layer 228, RDL (the chip with the redistribution layer 228 may also be referred to herein as chip element 102, 228), which is electrically conductively connected to the at least one chip contact.

The RDL layer 228 can have a thickness in a range of approximately 10 μm to approximately 40 μm, for example around 20 μm. The RDL 228 can comprise for example a copper-nickel-gold alloy, or some other suitable metal or for example a layer stack.

The thickness of the RDL 228 can be chosen in a ratio to the chip thickness that is in a range of approximately 0.1 to approximately 1, e.g. of approximately 0.3 to approximately 1.

In one exemplary embodiment, the RDL layer 228 can have a thickness of approximately 10 μm, and the chip 102 can have a thickness of approximately 30 μm.

The carrier 104 can comprise an electrically conductive region 110 (also referred to herein as upper metallization 110 or upper metallization layer 110). The electrically conductive region 110 can comprise for example copper, nickel, a copper-tin-zinc alloy or a layer stack composed of these and/or other metals. A thickness of the electrically conductive region can be for example in a range of approximately 8 μm to approximately 12 μm.

The redistribution layer 228 can be electrically conductively connected to the electrically conductive region 110 by means of an electrically conductive connection 222, for example by means of soldering (i.e. a solder) or by means of adhesive bonding (i.e. an electrically conductive adhesive).

In various exemplary embodiments, the RDL layer 228 can comprise at least two regions, e.g. a first region 228_1 and a second region 228_2, which can be electrically insulated from one another. The first region 228_1 can be connected to a first chip contact, and the second region
228_2 can be connected to a second chip contact. The first
region 228_1 and the second region 228_2 can be suitable
for example for being connected to two terminals of the
antenna 160, 162.

In this case, the antenna 160, 162 can be formed on or in
the carrier 104 (that is illustrated in FIG. 1A, for the antenna
160), on or in the interlayer 116 (that is illustrated in FIG.
1C, for the antenna 162), or both in the carrier 104 and in the
interlayer. One exemplary embodiment in which the antenna
160 and the antenna 162 are electrically conductively con-
nected to one another is not illustrated in the figures. FIG.
113 shows one exemplary embodiment in which only the
antenna 160 formed on the carrier 104 is electrically con-
ductively connected to the chip 102, and the antenna 162 as
booster antenna couples inductively to the antenna 160.

Depending on the design, the antenna 160, 162 and/or the
electrically conductive region 110 can be formed in such a
way that a current flow passes only along one of the main
sides of the carrier 104 and/or the interlayer 116, or in such
a way that the current flow is effected (e.g. by means of
through contacts 134 (in the interlayer 116 and/or in the
carrier 104) and optionally by means of metallizations 106
on the opposite side) along both main sides of the carrier 104
and/or the interlayer 116 and optionally through the carrier
104 and/or the interlayer 116. The through contacts can have
diameters in a range of approximately 70 µm to approxi-
mately 100 µm.

The chip 102 can be arranged in the cavity 330 in such a
way that the RDL layer 228 and the electrically conductive
region 110 face toward the same side of the carrier 104. In
various exemplary embodiments, a topmost surface of the
electrically conductive region 110 and a topmost surface of
the RDL layer 228 can form a common plane. The electri-
cally conductive region 110 and the RDL layer 228 can be
laterally spaced apart from one another. The spacing can be
or have been bridged by means of the electrically conductive
connection 222.

During the chip production method, the chip 102 can be
formed by means of singulating from a wafer. In this case,
it may be necessary (in this respect, see FIG. 4 as an
illustration) for the chip 102 arranged on an auxiliary carrier
440 to be detached from the auxiliary carrier 440, picked up
and placed in the cavity 330. This process is also referred to
as pick-and-place.

During a chip production method in accordance with the
prior art, the process sequence is typically configured such
that the chips 102 are finally arranged with the RDL layer
facing away from the auxiliary carrier 440.

For detachment from the auxiliary carrier 440, through
the auxiliary carrier 440 a pressure is exerted on the auxil-
iary carrier 440 and the chip 102 adhering thereto by way of
the semiconductor side.

In this case, damage to the chip 102 regularly occurs,
which reduces a yield.

In various exemplary embodiments, the process sequence
can be designed (optionally by means of an additional
relaminating process) in such a way that the chips adhere to
the auxiliary carrier 440 by way of the RDL layer 228 before
the pick-and-place process.

Figures 4A, 4B:
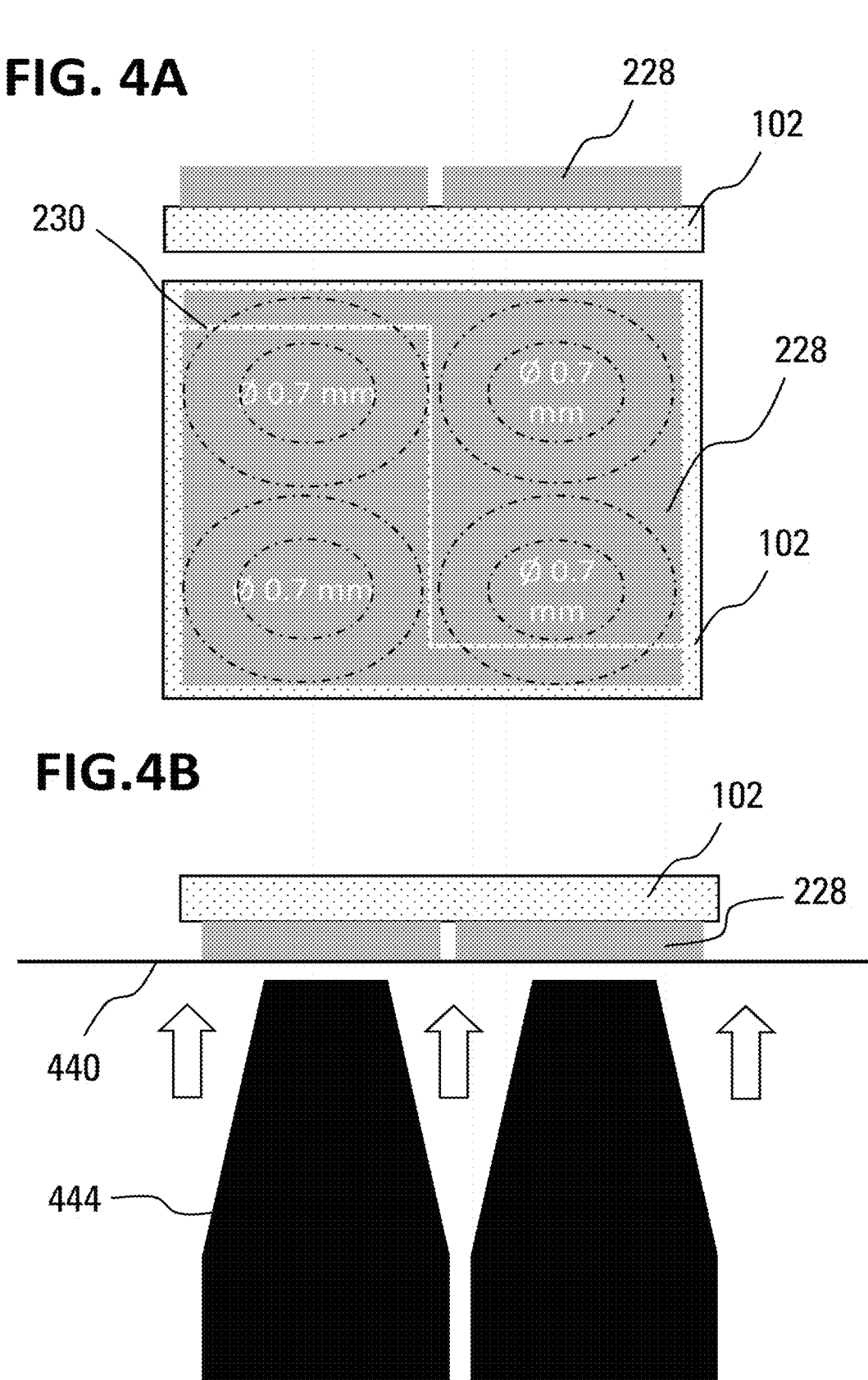
FIGS. 4A and 4B show an illustration of a chip detaching process.

A pressure (illustrated by means of arrows in FIG. 4B)
that is exerted on the auxiliary carrier 440 and the chip 102
in order to detach the chip 102, for example by means of a
plurality of punches or needles 444 (the "footprint" of which
on the chip 102 is illustrated in FIG. 4A), can in this case be
exerted directly on the RDL layer 228, which at least reduces
a probability of the detachment process resulting in damage.

A risk of damage or breaking can furthermore be reduced
by virtue of the fact that an insulating region 230, which
electrically insulates the first region 228_1 and the second
region 228_2 from one another, for the purpose of reducing
or avoiding a predetermined breaking location or predeter-
mined breaking edge is formed without a principal axis, or
has a principal axis, within which or in the extension of
which at least one part of the first region 228_1 and/or of the
second region 228_2 is arranged.

FIG. 2B illustrates a corresponding exemplary embodi-
ment: the principal axis of the insulating region 230 is
indicated in a dash-dotted manner. In an extension of the
insulating region 230 along the principal axis, there are still
situated in each case partial regions of the first region 228_1
(above in FIG. 2B) and/or of the second region 228_2
(below in FIG. 2B), which have a stabilizing effect vis-à-vis
breaking along the principal axis.

The first region 228_1 and the second region 228_2 can
for example each be formed in L-shaped fashion and be
arranged in a manner interleaved in one another, thus
resulting in a Z-shaped insulating region 230, or the insu-
lating region 230 can be formed for example in meandering
or serpentine fashion.

FIG. 5 shows a flow diagram 500 of a method for
producing a document structure.

The method comprises producing a chip structure, com-
prising forming a cavity in a carrier having a top side and an
under side (510), picking up a chip comprising at least one
chip contact and a redistribution layer connected to the at
least one chip contact by means of a picking-up device
detaching the chip from an auxiliary carrier, wherein the
chip bears on the auxiliary carrier by way of the RDL layer,
wherein the chip is lifted up from the auxiliary carrier by
means of pressure being exerted on the RDL layer, wherein
the lifted-up chip is picked up and inserted into the cavity,
wherein the RDL layer is oriented on the top side of the
carrier (520), fixing the chip in the cavity by means of an
adhesive (530), electrically conductively connecting the at
least one chip contact of the RDL layer to an electrically
conductive region of the carrier by means of an electrically
conductive material (540), and embedding the carrier
between a first paper layer and a second paper layer (550).

Some exemplary embodiments are specified in summary
below.

Exemplary embodiment 1 is a method for producing a
document structure. The method comprises producing a chip
structure, comprising forming a cavity in a carrier having a
top side and an under side, picking up a chip comprising at
least one chip contact and a redistribution layer connected to
the at least one chip contact by means of a picking-up device
detaching the chip from an auxiliary carrier, wherein the
chip bears on the auxiliary carrier by way of the RDL layer,
wherein the chip is lifted up from the auxiliary carrier by
means of pressure being exerted on the RDL layer, wherein
the lifted-up chip is picked up and inserted into the cavity,
wherein the RDL layer is oriented on the top side of the
carrier, fixing the chip in the cavity by means of an adhesive,
electrically conductively connecting the at least one chip
contact of the RDL layer to an electrically conductive region
of the carrier by means of an electrically conductive mate-
rial, and embedding the carrier between a first paper layer
and a second paper layer.

Exemplary embodiment 2 is a method in accordance with
exemplary embodiment 1, wherein the chip is arranged in
the cavity in such a way that the RDL layer and the
electrically conductive region face toward the same side of
the carrier.

Exemplary embodiment 3 is a method in accordance with exemplary embodiment 1 or 2, wherein the thickness of the RDL is chosen in a ratio to the chip thickness that is in a range of approximately 0.1 to approximately 1.

Exemplary embodiment 4 is a method in accordance with any of exemplary embodiments 1 to 3, wherein the pressure is exerted on the RDL layer by means of a plurality of punches.

Exemplary embodiment 5 is a method in accordance with any of exemplary embodiments 1 to 4, wherein the carrier comprises a flexible dielectric material, for example polyimide or polyethylene terephthalate.

Exemplary embodiment 6 is a method in accordance with any of exemplary embodiments 1 to 5, wherein the RDL layer has a thickness in a range of approximately 10 μm to approximately 40 μm.

Exemplary embodiment 7 is a method in accordance with any of exemplary embodiments 1 to 6, wherein the chip has a thickness in a range of approximately 20 μm to approximately 40 μm.

Exemplary embodiment 8 is a method in accordance with any of exemplary embodiments 1 to 7, wherein the RDL layer comprises a first region and a second region, which are separated from one another by an insulating region, wherein the insulating region for the purpose of reducing or avoiding a predetermined breaking location is formed without a principal axis, or has a principal axis, within which or in the extension of which at least one part of the first region and/or of the second region is arranged.

Exemplary embodiment 9 is a method in accordance with exemplary embodiment 8, wherein the first region and the second region are formed in L-shaped fashion and arranged in a manner interleaved in one another, wherein the insulating region is formed in Z-shaped fashion.

Exemplary embodiment 10 is a method in accordance with any of exemplary embodiments 1 to 9, wherein the electrically conductive region of the carrier is part of an antenna or has been or is electrically conductively connected to an antenna (described illustratively, forms a bridge to the antenna).

Exemplary embodiment 11 is a method in accordance with exemplary embodiment 10, wherein the antenna is formed at at least one position from a group of positions, wherein the group comprises the positions on or in the carrier and/or on or in the first paper layer and/or on or in the second paper layer.

Exemplary embodiment 12 is a method in accordance with any of exemplary embodiments 1 to 11, wherein the electrically conductive connecting comprises soldering or adhesive bonding.

Exemplary embodiment 13 is a document structure. The document structure comprises a first paper layer, a second paper layer and a chip structure between the first paper layer and the second paper layer, wherein the chip structure comprises a carrier having a cavity, a chip having at least one chip contact, wherein the chip is arranged in the cavity, wherein the chip has a chip thickness that is smaller than the depth of the cavity, and a redistribution layer, RDL, which is electrically conductively connected to the at least one chip contact, wherein the thickness of the RDL is chosen in a ratio to the chip thickness that is in a range of approximately 0.1 to approximately 1.

Exemplary embodiment 14 is a document structure in accordance with exemplary embodiment 13, wherein the carrier comprises an electrically conductive region, and wherein the redistribution layer is electrically conductively connected to the electrically conductive region.

Exemplary embodiment 15 is a document structure in accordance with exemplary embodiment 14, wherein the chip is arranged in the cavity in such a way that the RDL layer and the electrically conductive region face toward the same side of the carrier.

Exemplary embodiment 16 is a document structure in accordance with any of exemplary embodiments 13 to 15, wherein the thickness of the RDL is chosen in a ratio to the chip thickness that is in a range of approximately 0.1 to approximately 1.

Exemplary embodiment 17 is a document structure in accordance with any of exemplary embodiments 13 to 16, wherein the pressure is exerted on the RDL layer by means of a plurality of punches.

Exemplary embodiment 18 is a document structure in accordance with any of exemplary embodiments 13 to 17, wherein the carrier comprises a flexible dielectric material, for example polyimide or polyethylene terephthalate.

Exemplary embodiment 19 is a document structure in accordance with any of exemplary embodiments 13 to 18, wherein the RDL layer has a thickness in a range of approximately 10 μm to approximately 40 μm.

Exemplary embodiment 20 is a document structure in accordance with any of exemplary embodiments 13 to 19, wherein the chip has a thickness in a range of approximately 20 μm to approximately 40 μm.

Exemplary embodiment 21 is a document structure in accordance with any of exemplary embodiments 13 to 20, wherein the RDL layer has a thickness of approximately 10 μm and the chip has a thickness of approximately 30 μm.

Exemplary embodiment 22 is a document structure in accordance with any of exemplary embodiments 13 to 21, wherein the RDL layer comprises a first region and a second region, which are separated from one another by an insulating region, wherein the insulating region for the purpose of reducing or avoiding a predetermined breaking location is formed without a principal axis, or has a principal axis, within which or in the extension of which at least one part of the first region and/or of the second region is arranged.

Exemplary embodiment 23 is a document structure in accordance with exemplary embodiment 22, wherein the first region and the second region are formed in L-shaped fashion and arranged in a manner interleaved in one another, wherein the insulating region is formed in Z-shaped fashion.

Exemplary embodiment 24 is a document structure in accordance with exemplary embodiment 23, wherein the electrically conductive region of the carrier is part of an antenna or has been or is electrically conductively connected to an antenna.

Exemplary embodiment 25 is a document structure in accordance with exemplary embodiment 24, wherein the antenna is formed at at least one position from a group of positions, wherein the group comprises a position on or in the carrier and/or on or in the first paper layer and/or on or in the second paper layer.

Exemplary embodiment 26 is a document structure in accordance with exemplary embodiment 25, wherein the electrically conductive connection is a soldering connection or an adhesive bonding connection.

Further advantageous embodiments of the device are evident from the description of the method, and vice versa.

The invention claimed is:

1. A method for producing a document structure, the method comprising:

producing a chip structure, comprising:

forming a cavity in a carrier;

picking up a chip comprising at least one chip contact and a redistribution layer (RDL) connected to the at least one chip contact by means of a picking-up device detaching the chip from an auxiliary carrier, wherein the chip bears on the auxiliary carrier by way of the RDL, wherein the chip is lifted up from the auxiliary carrier by means of pressure being exerted on the RDL, and wherein the lifted-up chip is picked up and inserted into the cavity, fixing the chip in the cavity by means of an adhesive;

electrically conductively connecting the RDL to an electrically conductive region of the carrier by means of an electrically conductive material; and embedding the carrier between a first paper layer and a second paper layer.

2. The method as claimed in claim 1, wherein the chip is arranged in the cavity such that the RDL and the electrically conductive region face toward a same side of the carrier.

3. The method as claimed in claim 1, wherein a thickness of the RDL is chosen in a ratio to a chip thickness that is in a range of approximately 0.1 to approximately 1.

4. The method as claimed in claim 1, wherein the pressure is exerted on the RDL by means of a plurality of punches.

5. The method as claimed in claim 1, wherein the RDL has a thickness in a range of approximately 10 μm to approximately 40 μm.

6. The method as claimed in claim 1, wherein the chip has a thickness in a range of approximately 20 μm to approximately 40 μm.

7. The method as claimed in claim 1, wherein the RDL comprises a first region and a second region, which are separated from one another by an insulating region, wherein the insulating region in order to reduce or avoid a predetermined breaking location:

is formed without a principal axis, or has a principal axis, within which or in an extension of which at least one part of the first region and/or of the second region is arranged.

8. The method as claimed in claim 7, wherein the first region and the second region are formed in L-shaped fashion and arranged in a manner interleaved with one another, and wherein the insulating region is formed in Z-shaped fashion.

9. The method as claimed in claim 1, wherein the electrically conductive region of the carrier is part of an antenna or has been or is electrically conductively connected to an antenna.

10. The method as claimed in claim 1, wherein the electrically conductive connecting comprises soldering or adhesive bonding.

\* \* \* \* \*